July 24, 1956 M. B. GREGORY 2,756,287
AUDIO AMPLIFIER COMPENSATED GAIN CONTROL
Filed April 11, 1952
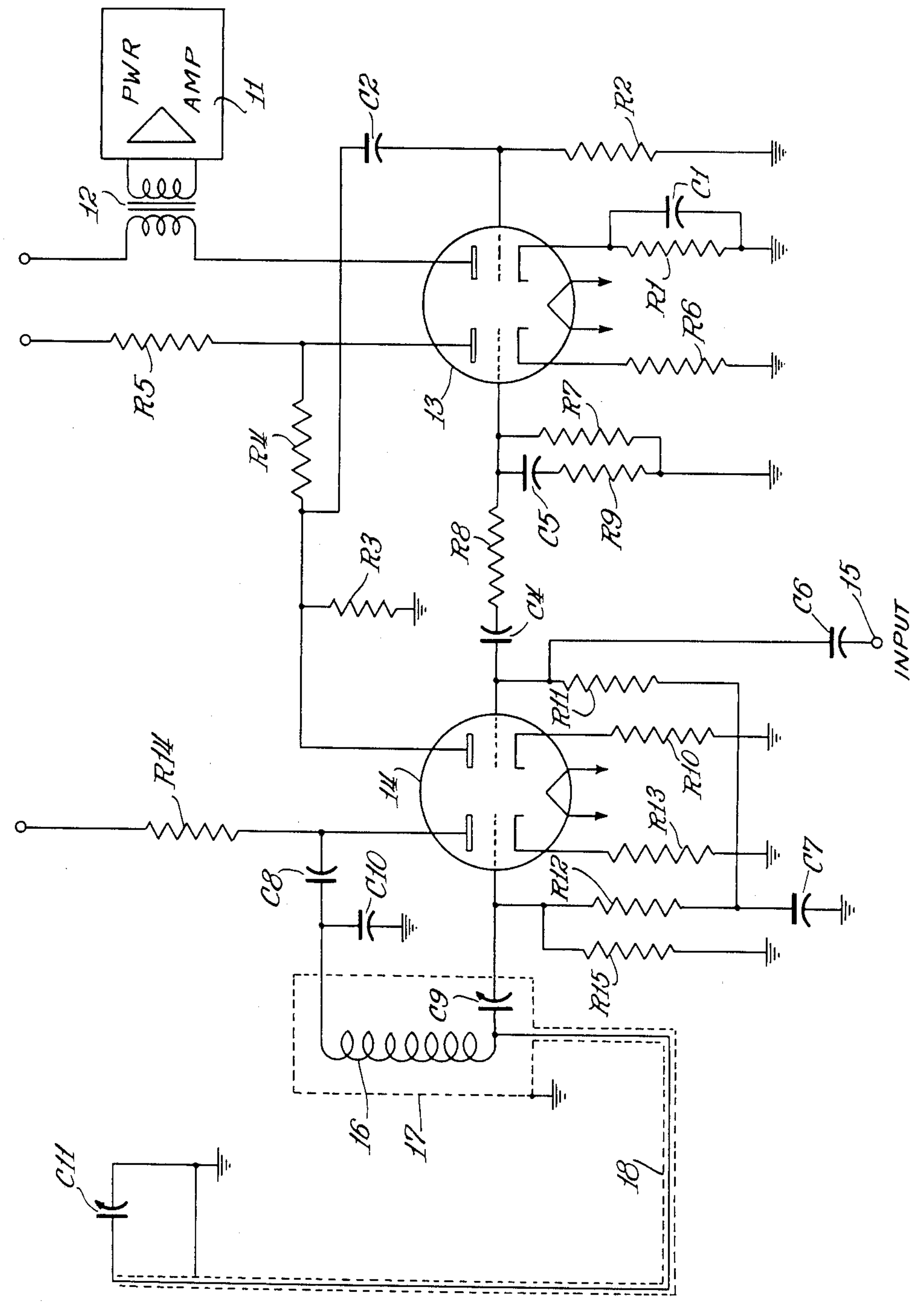
INVENTOR.
Marion B. Gregory
BY
Alois W. Graf
Atty United States Patent Office 2,756,287
Patented July 24, 1956

2,756,287

AUDIO AMPLIFIER COMPENSATED GAIN CONTROL

Marion B. Gregory, Cincinnati, Ohio, assignor to The Baldwin Piano Company, a corporation of Ohio Application April 11, 1952, Serial No. 281,755

2 Claims. (Cl. 179—171.9)

The present invention relates to an expression control having an electronic amplifier used with or forming a part of a musical instrument such as an electronic organ.

In providing an expression control for an amplifier in a musical instrument some arrangement must be provided whereby proper balance of the bass tones is obtained at low audio frequency levels. In providing an expression control for amplifiers used in conjunction with or forming a part of musical instruments it is desirable to avoid the use of high impedance circuits and any step by step devices. Sliding contacts are subject to wear and require frequent attention and repair, and consequently are to be avoided.

In accordance with the present invention an expression control for electronic amplifiers is provided by a manually operable variable impedance device associated with circuit means which control the gain of an amplifier. The amplifier is associated with a circuit which provides the proper balance of bass tones at the lower levels of amplification.

It, therefore, is an object of the present invention to provide an improved simplified expression control for an electronic amplifier used in conjunction with musical instruments.

Still another object of the present invention is to provide an improved expression or volume control for an electronic amplifier which uses a minimum number of tubes and circuit components.

A still further object of the invention is to provide a smooth continuous stepless control of the amplification of an audio frequency amplifying system.

A still further object of the invention is to provide in an audio frequency amplifying system the proper bass emphasis at low audio levels.

A still further object of the invention is to provide an expression control or gain control wherein the response to the manual or pedal actuation of the control element can be delayed.

Other and further objects of the invention will become apparent from the following description taken in conjunction with the accompanying drawing which shows a circuit diagram of an amplifying system having an expression control.

In the drawing there is shown a power amplifier 11 connected by a transformer 12 to one triode portion of a dual triode tube 13. This triode portion receives audio frequency energy fom the other triode portion of the vacuum tube 13 and also from one triode portion of another dual triode vacuum tube 14. The remaining triode portion of the vacuum tube 14 is connected in an oscillator circuit, the purpose of which subsequently will become apparent.

The triode unit which has its output connected to the transformer 12 has its cathode biased by a resistor R1 having one terminal connected to ground. A suitable bypass capacitor C1 is connected in parallel to the resistor R1 to prevent loss of low frequency response to audio frequency signals to be handled by this triode portion of the vacuum tube 13. The grid of the vacuum tube triode is connected to ground through a resistor R2 and is coupled to the preceding triode portions by a capacitor C2. The capacitor C2 is connected to the juncture between resistors R3 and R4 which are connected between ground and a resistor R5 connected to a suitable source of anode potential. Thus it will be apparent that the capacitor C2 is connected to a bleed resistor circuit which is provided so that substantially constant anode potential will be applied to the first triode unit of the vacuum tube 13 and to the second triode unit of vacuum tube 14. The anode of the former unit is connected to the juncture between the resistors R4 and R5. The cathode of this triode unit is biased by a cathode resistor R6. The grid of this triode unit is connected to ground through a grid resistor R7. The grid of the first triode unit of the vacuum tube 13 is connected to a circuit including a capacitor C4, a resistor R8, a capacitor C5 and a resistor R9 comprising a series circuit wherein the resistor R9 is connected to ground. The capacitor C4 is connected to the grid of the second triode unit of the vacuum tube 14 and to a coupling capacitor C6 connected to the input terminal 15. The circuit arrangement including the capacitors C4 and C5 and the resistors R8 and R9 is provided so that the first triode portion of the vacuum tube 13 will amplify to a greater extent the lower audio frequencies generally referred to as being the bass tones.

The input circuit from the terminal 15 connected to the grid of the second triode portion of the vacuum tube 14 is arranged to amplify the entire range of audio frequencies. This triode portion of the vacuum tube 14 is suitably biased by a grounded cathode resistor R10. A grid resistor R11 connected to the grid of this triode unit is connected to the common juncture between a capacitor C7 and a resistor R12 forming a filter circuit associated with the first triode unit of the vacuum tube 14.

The first triode unit of the vacuum tube 14 is provided with a suitable cathode bias resistor R13 connected between the cathode and the ground. Suitable anode potential is supplied through the anode coupling resistor R14. The anode is connected through a capacitor C8 to one end of an inductor 16 which preferably is enclosed within a shield represented by the dotted line 17. The other end of the inductor 16 is connected through an adjustable capacitor C9 to the grid of the first triode section of the vacuum tube 14. The grid of this triode section is provided with a grid resistor R15 which is connected to ground. The anode end of the inductor 16 is connected through a capacitor C10 to ground, and the other end of the inductor 16 is connected through a shielded conductor 18 to a variable capacitor C11 which in turn is connected to ground. The variable capacitor C11 is pedally operable and constitutes the immediate control element for the circuit system shown to provide an expression control.

The first triode unit of the vacuum tube 14 with its associated circuit components constitutes an oscillator of super-audible or radio frequency. Between ground and the grid of the oscillator section of tube 14 are connected in series a resistor R12 and capacitor C7, which together serve as a filter for the rectified potential appearing on the said grid. By applying to the grid of the second triode section of tube 14 the potential appearing across the capacitor C7, I provide a negative bias which varies with the amplitude of the oscillations of the first section of the tube 14. Consequently, a variation in the value of the pedally-operated capacitor C11, which causes a variation in the amplitude of the oscillations, will vary the bias on, hence the gain of, the amplifying second triode section of tube 14. By utilizing the self-rectifying properly of this oscillator circuit I have thus provided the necessary bias potential without the use of an auxiliary rectifier.

Actuation of the expression control capacitor C11 can vary the gain of the second triode portion of the vacuum tube 14 from full amplification down to substantially cut off condition. At the lower gain values of the second triode section of the vacuum tube 14, the first triode section of the vacuum tube 13 will supply the lower audio frequencies to the second triode portion of the vacuum tube 13 to such an extent that the lower audio frequencies corresponding to bass tones predominate in the output of this triode section which serves as a preamplifier or mixing tube for the power amplifier 11. The first triode portion of the vacuum tube 13 has its circuit constants so arranged as to provide a substantially constant gain characteristic at a relatively low level. Thus the low audio frequency components of the signal obtained from the input circuit will be predominant at low gain values of the second triode portion of the vacuum tube 14, but will not be appreciable at high gain values.

For some uses or installations of the system shown in the figure it may be desirable to provide for delayed action of the change in gain control of the second triode portion of the vacuum tube 14. This can be accomplished by increasing the values of the resistor R12 and the capacitor C7. This may be utilized to introduce a slight time delay both to simulate conditions in certain type organs (wherein response to pedal actuation is not immediate) or to overcome any deleterious effects which otherwise might be produced by an excessively rapid actuation of the capacitor C11 tending to abruptly reduce the gain of the second triode portion of the vacuum tube 14.

From the foregoing it will be appreciated that there has been provided an expression control for an audio frequency amplifier system wherein the low frequencies corresponding to the bass tones predominate at low audio value levels. This has been accomplished by controlling the amplitude of oscillations generated by a super-audio frequency or low radio frequency oscillator. The self-rectifying characteristics of the oscillator have been used to develop a bias potential for a variable gain audio frequency channel which is in parallel with another audio frequency channel of low fixed gain characteristics by amplifying primarily the lower frequencies so as to correspond generally to a bass boost channel.

In order that those skilled in the art may be able to ascertain certain further details of the invention it is believed helpful to set forth the values of the components used in an exemplary embodiment. It is to be understood, however, that this in no way is an indication of any limitation of the invention. It previously has been mentioned and will be understood by those skilled in the art that certain variations accordingly would follow dependent upon particular installations. The vacuum tubes 13 and 14 in the particular embodiment for which the following component values apply comprised two 6SN7 tubes. Where the expression control is to be subject to an additional time delay the values for the resistor R12 and the capacitor C7 are one-half megohm and one-half microfarad respectively.

| | |
|---|---|
| C1 | 50 mf. |
| C2 | .01 mf. |
| C4 | .01 mf. |
| C5 | .02 mf. |
| C6 | .01 mf. |
| C7 | .1 mf. |
| C8 | 1000 mf. |
| C9 | 25–100 mmf. |
| C10 | 50 mmf. |
| C11 | 25–250 mmf. |
| R1 | 2.2 k. |
| R2 | 470 k. |
| R3 | 120 k. |
| R4 | 47 k. |
| R5 | 15 k. |
| R6 | 1. k. |
| R7 | 1. meg. |
| R8 | 220 k. |
| R9 | 22 k. |
| R10 | 1. k. |
| R11 | 470 k. |
| R12 | 22 k. |
| R13 | 470 k. |
| R14 | 47 k. |
| R15 | 47 k. |

While for the purpose of illustrating and describing the present invention a particular embodiment has been shown in the circuit diagram of the drawing, it is to be understood that the invention is not to be limited thereby since such variations in the circuit arrangement and in the components employed are contemplated as may be commensurate with the spirit and scope of the invention set forth in the accompanying claims.

I claim as my invention:

1. In an audio frequency amplifier system, a low frequency low gain amplifier connected between a signal source and a power amplifier, a variable gain audio frequency amplifier connected between said signal source and said power amplifier, a super-audio frequency oscillator having a vacuum tube, an inductive circuit capacitively connected between the grid and anode of said tube, a remotely positioned variable capacitor connected between ground and the grid circuit of said tube to control the amplitude of the oscillations being generated, and a filter circuit connected between said grid and ground including a resistor and a capacitor, said capacitor being next to ground, and a connection between said latter amplifier and the juncture between said latter capacitor and said resistor of said filter circuit to supply a gain control bias thereto.

2. In an audio frequency amplifier system, an audio frequency input circuit and an output circuit, an audio frequency amplifier interconnecting said circuits, a radio frequency oscillator having a vacuum tube, a series circuit connected between the ground and the grid of said tube including a capacitor and a resistor, a remotely positioned variable capacitor connected to the grid of said oscillator for varying the amplitude of the oscillations being generated thereby to vary the voltage appearing across said first capacitor, a connection from the juncture of said first capacitor and said resistor to the input circuit of said amplifier to control the gain thereof, and a second amplifier of substantially constant low level gain interconnecting said input and output circuits and being more responsive to the lower audio frequencies present in said input circuit whereby at low gain levels of said first amplifier the lower audio frequencies predominate in the output circuit.

References Cited in the file of this patent

UNITED STATES PATENTS

| | | |
|---|---|---|
| 1,881,284 | MacDonald | Oct. 4, 1932 |
| 2,008,825 | Hammond | July 23, 1935 |
| 2,072,365 | Grimes | Mar. 2, 1937 |
| 2,270,789 | Smith | Jan. 20, 1942 |
| 2,296,626 | Blumlein | Sept. 22, 1942 |
| 2,505,254 | Mesner | Apr. 25, 1950 |
| 2,527,441 | O'Brien | Oct. 24, 1950 |
| 2,606,972 | Scott | Aug. 12, 1952 |
| 2,623,954 | Van Zelst | Dec. 30, 1952 |
| 2,626,354 | Cheek | Jan. 20. 1953 |